United States Patent
Hirler et al.

(10) Patent No.: US 7,989,885 B2
(45) Date of Patent: Aug. 2, 2011

(54) SEMICONDUCTOR DEVICE HAVING MEANS FOR DIVERTING SHORT CIRCUIT CURRENT ARRANGED IN TRENCH AND METHOD FOR PRODUCING SAME

(75) Inventors: Franz Hirler, Isen (DE); Frank Dieter Pfirsch, Munich (DE)

(73) Assignee: Infineon Technologies Austria AG, Villach (AT)

( * ) Notice: Subject to any disclaimer, the term of this patent is extended or adjusted under 35 U.S.C. 154(b) by 273 days.

(21) Appl. No.: 12/393,210

(22) Filed: Feb. 26, 2009

(65) Prior Publication Data
US 2010/0213505 A1    Aug. 26, 2010

(51) Int. Cl.
H01L 29/732    (2006.01)
H01L 21/8249    (2006.01)
(52) U.S. Cl. ........ 257/330; 257/334; 257/577; 257/586; 257/E27.022; 257/E27.079; 438/237; 438/328
(58) Field of Classification Search .................. 257/161, 257/490, E27.022, E27.079; 438/336
See application file for complete search history.

(56) References Cited

U.S. PATENT DOCUMENTS

| | | | |
|---|---|---|---|
| 4,890,143 A | 12/1989 | Baliga et al. | |
| 5,198,687 A | 3/1993 | Baliga | |
| 5,294,816 A | 3/1994 | Shekar et al. | |
| 5,412,228 A | 5/1995 | Baliga | |
| 5,488,236 A | 1/1996 | Baliga et al. | |
| 6,259,134 B1 * | 7/2001 | Amaratunga et al. | 257/330 |
| 6,392,273 B1 | 5/2002 | Chang | |
| 6,399,998 B1 | 6/2002 | Chang | |
| 6,781,199 B2 | 8/2004 | Takahashi | |
| 7,098,488 B2 | 8/2006 | Yoshikawa et al. | |
| 7,132,712 B2 | 11/2006 | Kocon et al. | |
| 7,319,257 B2 | 1/2008 | Yamaguchi et al. | |
| 7,875,951 B2 * | 1/2011 | Rieger et al. | 257/488 |
| 2006/0113589 A1 * | 6/2006 | Jones | 257/330 |
| 2007/0138544 A1 * | 6/2007 | Hirler et al. | 257/330 |

FOREIGN PATENT DOCUMENTS
WO    9322798    11/1993

OTHER PUBLICATIONS

Constapel et al., Trench-IGBTs with Integrated Diverter Structures, International Symposium on Power Semiconductor Devices and ICs, 1995, pp. 201-206.

* cited by examiner

*Primary Examiner* — Stephen W Smoot
(74) *Attorney, Agent, or Firm* — Dicke, Billig & Czaja, P.L.L.C.

(57) ABSTRACT

A semiconductor device has a first semiconductor layer of a first conductivity type and a second semiconductor layer of a second conductivity type complementary to the first conductivity type arranged in or on the first semiconductor layer. The semiconductor device has a region of the first conductivity type arranged in the second semiconductor layer. A first electrode contacts the region of the first conductivity type and the second semiconductor layer. A trench extends into the first semiconductor layer, and a voltage dependent short circuit diverter structure has a highly-doped diverter region of the second conductivity type. This diverter region is arranged via an end of a channel region and coupled to a diode arranged in the trench.

22 Claims, 6 Drawing Sheets

SEMICONDUCTOR DEVICE HAVING MEANS FOR DIVERTING SHORT CIRCUIT CURRENT ARRANGED IN TRENCH AND METHOD FOR PRODUCING SAME

BACKGROUND

The application relates generally to a semiconductor device with a first semiconductor layer of a first conductivity type. The semiconductor device includes a second semiconductor layer of a second conductivity type complementary to the first conductivity type, the second semiconductor layer being arranged in or on the first semiconductor layer. This second semiconductor layer includes a region of the first conductivity type. A first electrode contacts this region of the first conductivity type and the second semiconductor layer. A trench extends through the second semiconductor layer into the first semiconductor layer.

Such a semiconductor device therefore has the basic structure of an IGBT (insulated gate bipolar transistor) or a MOS-FET. In the development of new generations of such semiconductor devices the on-state losses $V_{CE,\ sat}$ are to be reduced. In principle, this can be achieved by increasing the channel width while retaining the same carrier profile in the first semiconductor layer. This, however, also increases the short circuit current, so that the semiconductor device can be destroyed prematurely in a short circuit situation before a suitable gate driver can switch off the semiconductor device.

A measure for the prevention of latch-up is known wherein a diverter structure is provided in the region of the trench base, the structure being of the complementary conductivity type and doped more highly than the surrounding drift zone of the first semiconductor layer. For this purpose, the diverter structure is connected to the first electrode via a resistor. Through this connection, however, holes can leak away even in the on-state, whereby $V_{CE,\ sat}$ is increased significantly in a suitably conductive connection.

In another known method, a p-type region located on a trench side opposite the channel is connected to the emitter potential via a diode, a resistor or a MOS transistor. The EMI (electromagnetic interference) behaviour can thereby be improved in the switching-on of such a semiconductor device without discharging via this p-type region of the second semiconductor layer in the on-state a hole current so high that the charge carrier flooding or the short circuit current in the on-state would be reduced significantly.

SUMMARY

An embodiment includes a semiconductor device having a first semiconductor layer of a first conductivity type and a second semiconductor layer of a second conductivity type complementary to the first conductivity type arranged in or on the first semiconductor layer. Further, the semiconductor device includes a region of the first conductivity type arranged in the second semiconductor layer. A first electrode contacts the region of the first conductivity type and the second semiconductor layer. A trench extends into the first semiconductor layer, and a voltage dependent short circuit diverter structure includes a highly-doped diverter region of the second conductivity type. This diverter region is arranged via an end of a channel region and coupled to a diode arranged in the trench.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
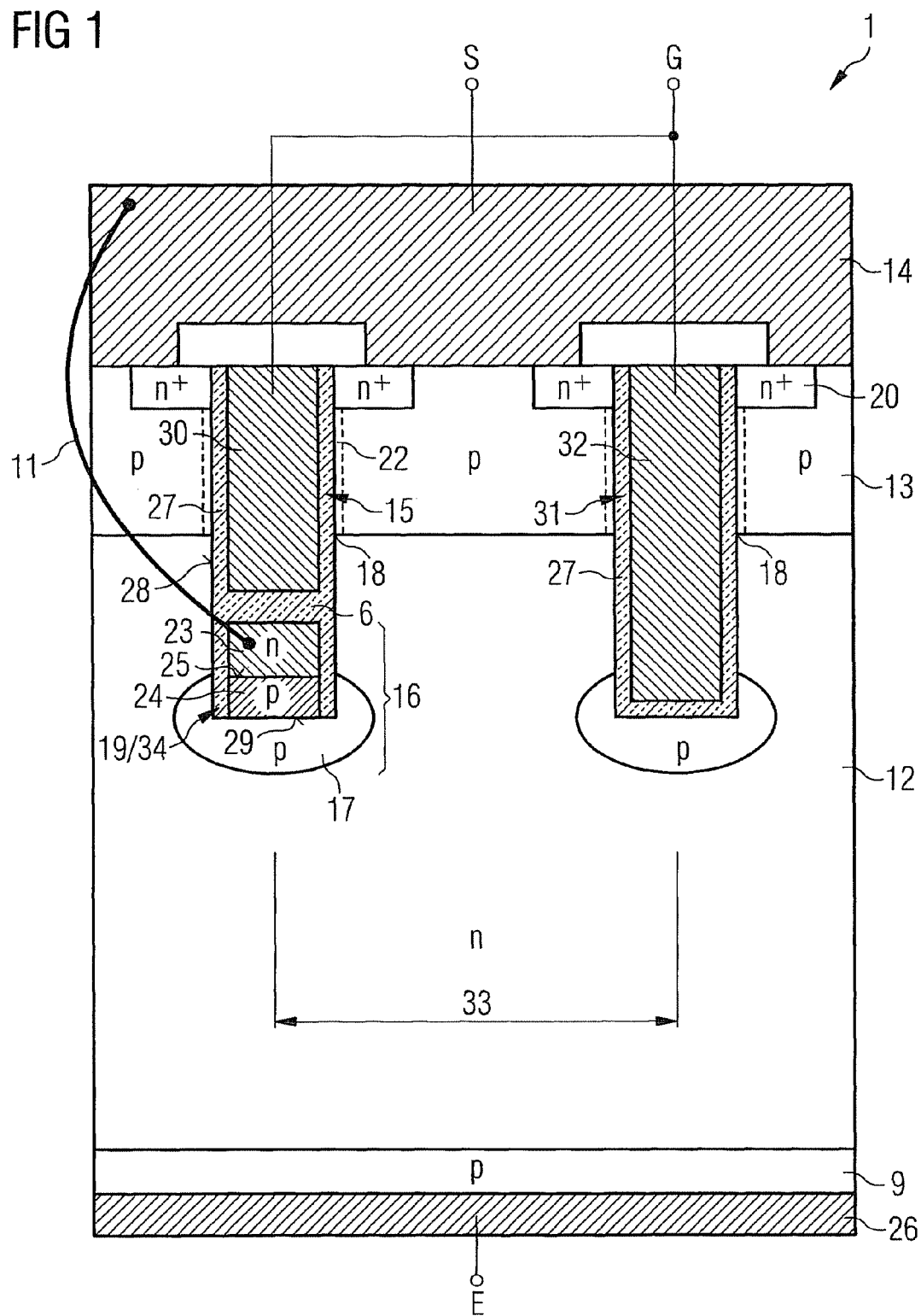
FIG. 1 illustrates a diagrammatic cross-section through a semiconductor device.

FIG. 1 illustrates a diagrammatic cross-section through a semiconductor device 1. This embodiment includes a MOS-controlled semiconductor device 1 including a channel region 22, a trench 15 and a voltage dependent short circuit diverter structure 16, wherein the voltage dependent short circuit diverter structure 16 includes a voltage limiting device 34 arranged in the trench 15 and coupled to a diverter region 17 arranged at an end 18 of the channel region 22. The diverter region 17 is coupled via the voltage limiting device 34 to a first electrode 14 of the MOS-controlled semiconductor device 1 via a connection path 11. In the illustrated embodiment, the MOS-controlled semiconductor device 1 is an insulated gate bipolar transistor (IGBT). Additionally, a gate electrode 30 is arranged in the trench 15.

Near the channel end 18 of the MOS-controlled semiconductor device 1, the diverter region 17 is typically provided at a distance of 100 nanometers to a few micrometers. In the illustrated embodiment, the diverter region 17 is p-type and the first electrode 14 is a source electrode S.

In a short circuit situation, the diverter region 17 may limit the voltage dropping at the MOS channel 22. As a result, the saturation current of a first conductivity type of the MOS channel 22 may be limited to a lower value, thus limiting the overall load current, to which is added the current of a second conductivity type of a back side emitter 9, which is complementary to the first conductivity type. This enhances the short circuit strength of the semiconductor device 1.

The voltage dependent short circuit diverter structure 16 can be implemented in various embodiments without being flooded and thus influenced by the hole injection of the back side emitter 9. At a low voltage of less than 300 mV, no or only very little leakage current flows through the voltage dependent short circuit diverter structure 16. At a higher voltage of some 100 mV or a few V, on the other hand, a high current flows through the voltage dependent short circuit diverter structure 16.

The voltage dependent short circuit diverter structure 16 is capable of carrying high hole currents of typically ⅓ of the short circuit current. For this reason, the diverter region 17 is in this semiconductor device connected to the first electrode 14, which is a source electrode S in this embodiment, by the voltage limiting device 34 for each individual or at least for some of the n-MOS cells 33.

The voltage limiting device 34 may be represented by a forward-biased diode 19 as illustrated in FIG. 1, or alternatively a reverse-biased Zener diode, a MOS channel the gate of which is suitably driven high at a high drain voltage, or else by thyristors, varistors etc. These elements may be made of polysilicon, amorphous silicon or other materials which are easily integrated into the trench of a silicon semiconductor body, such as germanium, silicon carbide, zinc oxide or III-V compound semiconductors.

In such a semiconductor device as illustrated in FIG. 1, a minimum $V_{CE, sat}$ increase is achieved combined with a noticeable reduction of short circuit current, a minimum increase of leakage current and a minimum reduction of breakdown voltage. As simulations have established, short circuit current can be reduced by two orders of magnitude. As an alternative, the channel width can be increased accordingly, whereby the forward voltage $V_{CE, sat}$ can be reduced significantly. This allows the implementation of the IGBT illustrated by way of example in FIG. 1, which, compared to a conventional IGBT, has a $V_{CE, sat}$ reduced from 1.7 V to 1.1 V while having the same short circuit and switching characteristics.

In the embodiment illustrated in FIG. 1, a first semiconductor layer 12 forms a drift zone region of a first conductivity type n, while a second semiconductor layer 13 arranged in or on the first semiconductor layer 12 forms base zones of a second conductivity type p complementary to the first conductivity type n, wherein channels 22 are formed between a region 20 of highly-doped semiconductor material of the first conductivity type and the first semiconductor layer 12, if the gate electrodes 30 and 32 in the trenches 15 and 31 are driven accordingly. Within the trench 15 below the gate electrode 30, a diode structure 19 is arranged which connects the diverter region 17 via the forward-biased diode 19 with a p-type diode region 24 in contact with the diverter region 17, a p-n junction 25 and an n-type diode region 23 and via a path 11 to the first electrode 14, which is a source electrode S in the illustrated embodiment.

An insulating layer 6 is provided between the end of the gate electrode 30 and the n-type diode region 24 to insulate the control potential of the gate electrode 30 electrically from the function of the voltage dependent short circuit structure 16. Further insulating layers 27 extend along the side walls 28 of the trench 15 as gate oxides, while the diode structure arranged on the base 29 of the trench 15 is separated from the gate electrode 30 by the horizontal insulating layer 6 referred to above. FIG. 1 further illustrates a second trench region 31 which likewise includes a gate electrode 32, but there is no diode provided on the base 29 of this second trench 31. A semiconductor device 1 can include a plurality of cells 33, and either each of the cells 33 or at least the plurality of the cells 33 may be provided with a voltage dependent short circuit diverter structure 16.

A parasitic n-p-n transistor illustrated in FIG. 1 is not active and does not affect the operation of the semiconductor device 1, as the transistor gain is suppressed by the short charge carrier life, in particular in the p-type diode region 24.

An embodiment of a method for producing a semiconductor device 1 includes providing a semiconductor substrate having a first semiconductor layer 12 of a first conductivity type and a second semiconductor layer 13 of a second conductivity type complementary to the first conductivity type arranged in or on the first semiconductor layer 12. Further, the semiconductor substrate includes a region 20 of the first conductivity type arranged in the second semiconductor layer 13 and a first electrode 14 contacting the region 20 of the first conductivity type and the second semiconductor layer 13.

A trench 15 extends into the first semiconductor layer 12. At an end of a channel region 22, a highly-doped region 17 of the second conductivity type is produced by depositing a layer 24 of the second conductivity type in the trench 15 onto the base 29 of the trench 15 followed by a diffusion process. A diode structure 19 is completed by depositing a layer 23 of the first conductivity type in the trench 15 onto the layer 24 of the second conductivity type in the trench 15 producing a p-n junction 25 there between.

In a further embodiment, a highly-doped region 17 of the second conductivity type is produced at an end of a channel region 22 and a layer 24 of the second conductivity type is deposited in the trench 15 onto the highly-doped region 17 of the second conductivity type. A diode structure 19 is completed by depositing a layer 23 of the first conductivity type in the trench 15 onto the layer 24 of the second conductivity type in the trench 15 onto the layer 24 of the second conductivity type in the trench 15 producing a p-n junction 25 there between.

This method describes the processes taken to implement embodiments of the voltage limiting device 34 in the form of a diode 19 in the trench 15. Thereafter an insulating layer 6 is deposited in the trench 15 onto the layer 23 of the first conductivity type and a gate electrode 30 is deposited onto the insulating layer 6. The highly-doped region 17 of the second conductivity type surrounds the base 29 of the trench 15 and can also be deposited onto the base and diffused through the base 29 before the structure 19 is performed onto an implemented base 29 of the trench 15.

A connection along the path 11 is arranged to couple the highly-doped region 17 of the second conductivity type to the first electrode 14 via the layer 24 of the second conductivity type arranged in the trench 15 and the layer 23 of the first conductivity type arranged in the trench 15.

Figure 2:
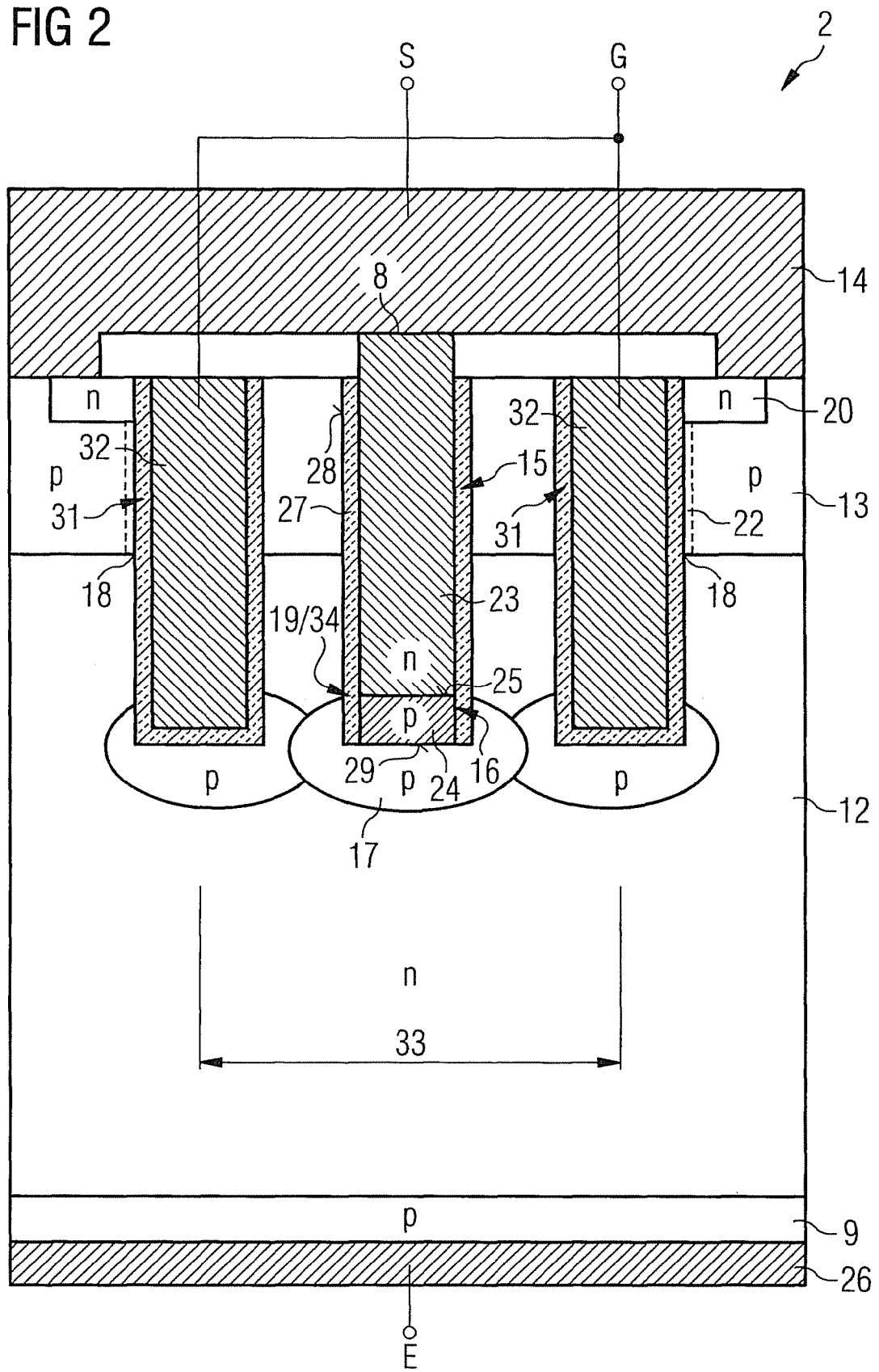
FIG. 2 illustrates a diagrammatic cross-section through a semiconductor device.

FIG. 2 illustrates a diagrammatic cross-section through a semiconductor device 2. Components of the same function as in FIG. 1 are identified by the same reference numbers and not explained again. In this embodiment, two further trenches 31 which are capable of forming channels 22 are provided adjacent to the trench 15. In a region not illustrated in the drawing, the trench 15 may include a gate electrode having the diode structure at the end of the channel as in FIG. 1. FIG. 2 illustrates, however, that the layer 23 is at one point extended from the p-n junction 25 within the trench 15 to the first electrode 14 in order to connect the diode 19 as a voltage limiting device 34 within the semiconductor device 2 electrically to the first electrode 14 via a connection 8.

It is also possible to connect the diverter region 17 arranged below the trench 15 indirectly to the first electrode 14 by connecting the diverter region 17 to a further region below another trench and by connecting this further region electrically to the first electrode 14 via a voltage limiting device 34.

Figure 3:
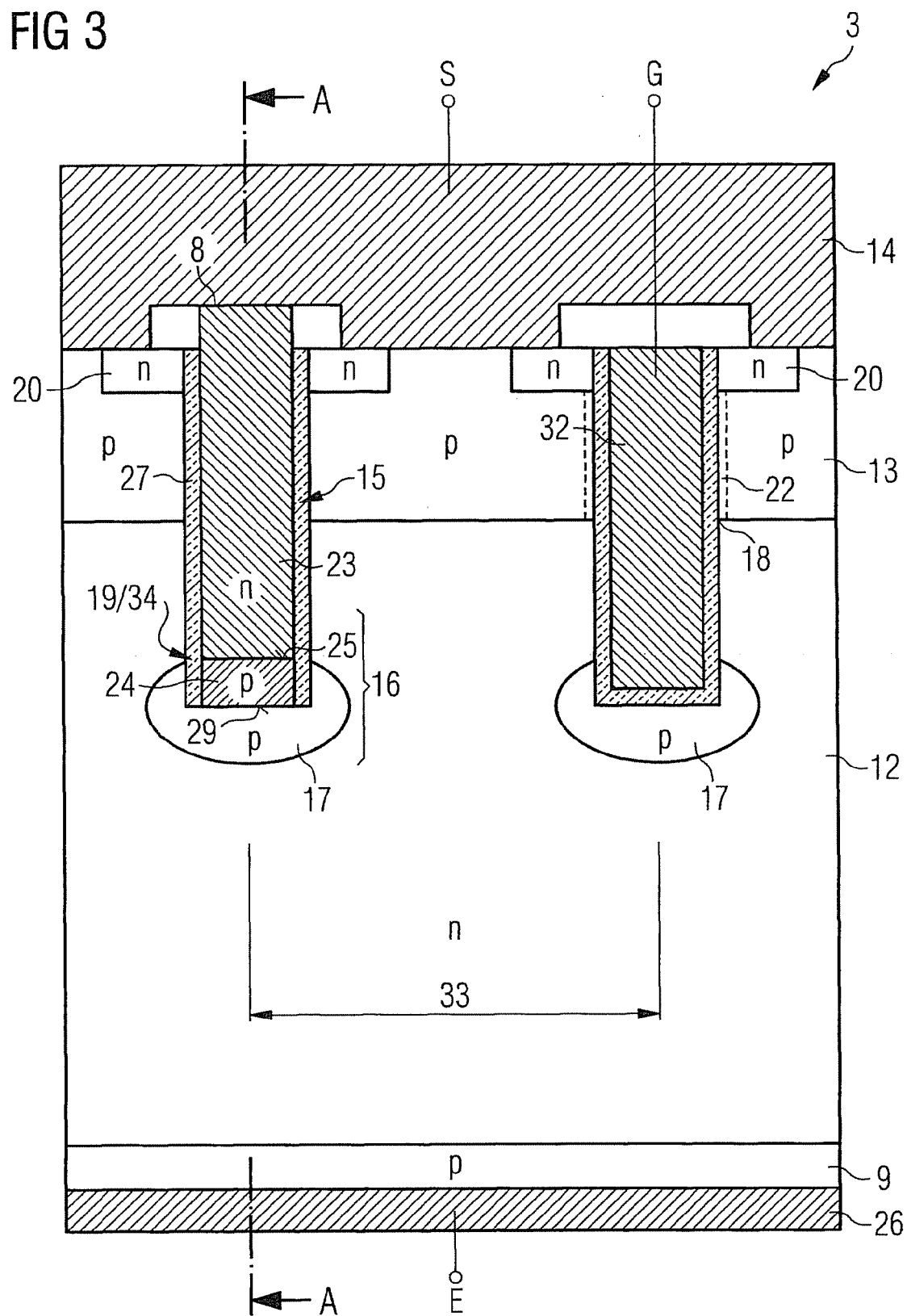
FIG. 3 illustrates a diagrammatic cross-section through a semiconductor device.
Figure 4:
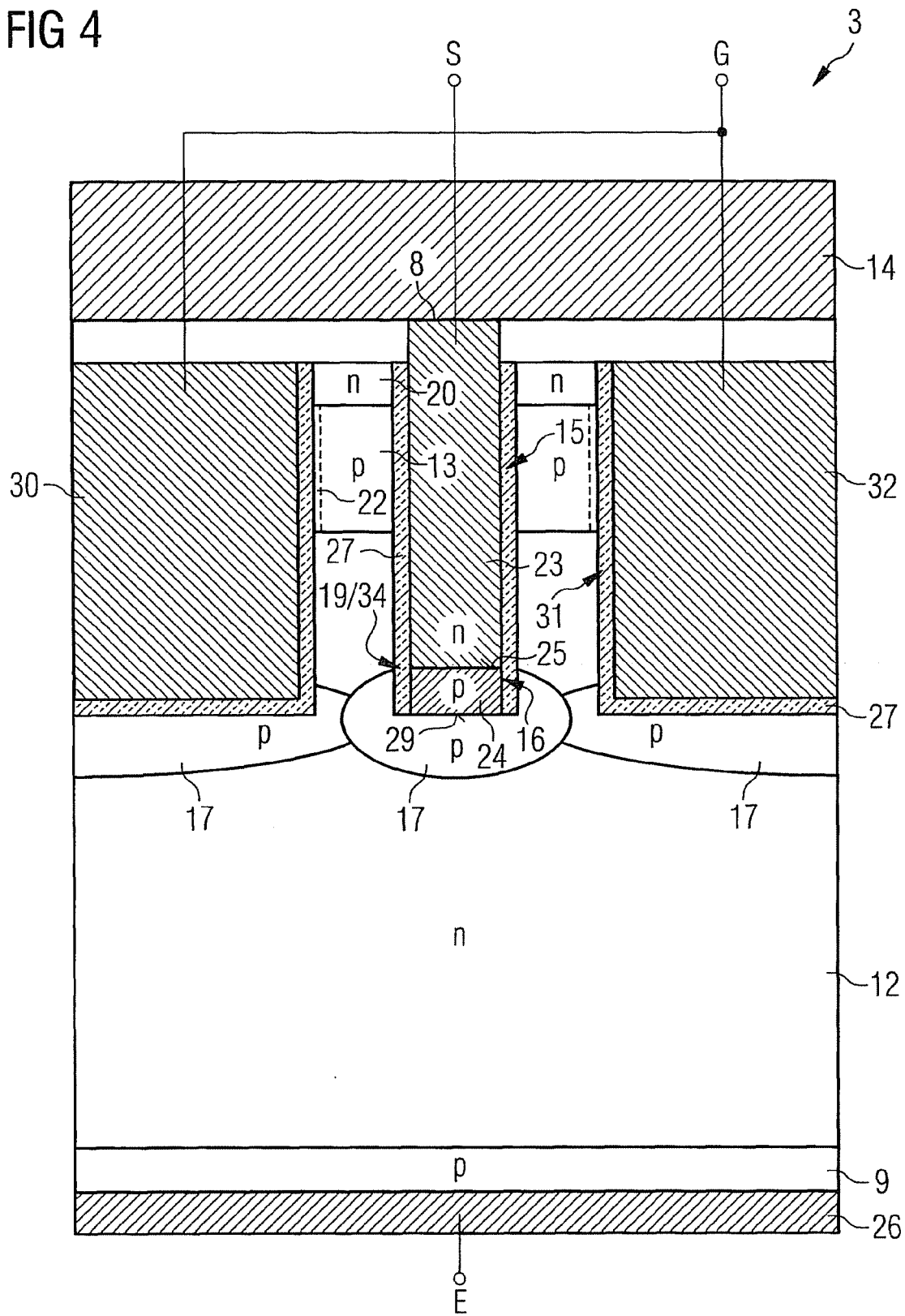
FIG. 4 illustrates a diagrammatic cross-section through a semiconductor device according to FIG. 3 along line A-A in FIG. 3.

FIG. 3 illustrates a diagrammatic cross-section through a semiconductor device 3. Components of the same function as in the preceding figures are identified by the same reference numbers and not explained again. In this embodiment, a trench 15 is arranged along the line A-A; this corresponds to the trench 15 in FIG. 2 and connects the n-type diode region 23 to the potential of the first electrode 14 via the connection 8. As FIG. 4 illustrates, gate electrodes 30 and 32 are arranged adjacent to this trench 15, which enable the regions 20 of the highly-doped first conductivity type to be connected via the second layer 13 designed as a base zone to the first layer 12 via channels 22 forming at a suitable voltage at the gate electrodes 30 and 32.

The interposed central voltage dependent short circuit diverter structure 16 ensures that the losses in the on-state of this semiconductor device 3 are reduced, as the leakage current is low at low voltages, while a high current can be discharged at some 100 mV or a few V, wherein high hole currents of typically ⅓ of the short circuit current flow through the voltage dependent short circuit diverter structure 16 to the first electrode 14.

It is also possible to connect the diverter region 17 arranged below the trench 15 indirectly to the first electrode 14 by connecting the diverter region 17 to a further region below another trench and by connecting this further region electrically to the first electrode 14 via a voltage limiting device 34.

Figure 5:
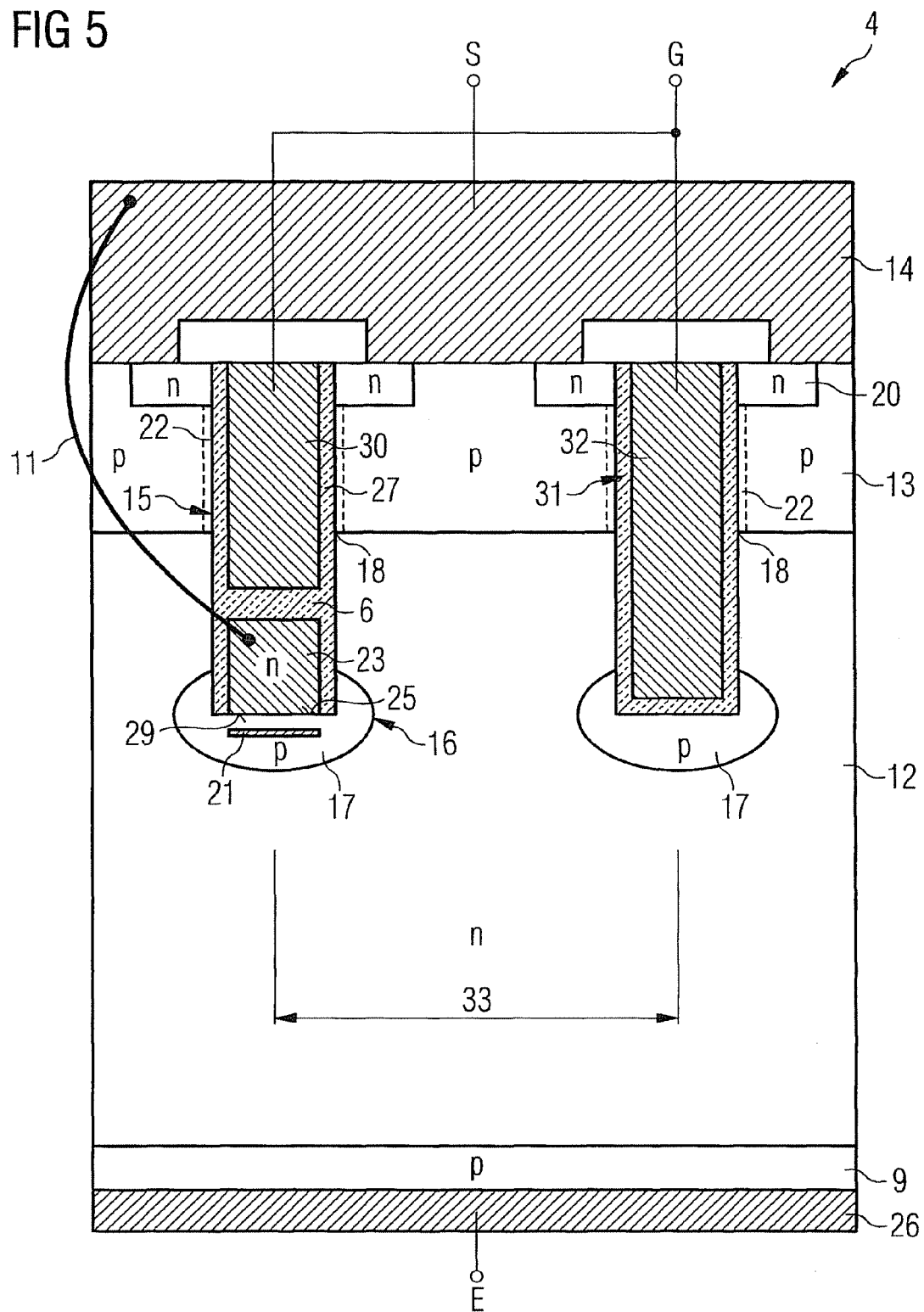
FIG. 5 illustrates a diagrammatic cross-section through a semiconductor device.

FIG. 5 illustrates a diagrammatic cross-section through a semiconductor device 4. Components of the same function as in the preceding figures are identified by the same reference numbers and not explained again. This embodiment differs from the embodiment illustrated in FIG. 1 in that the p-n junction is formed between an n-type diode region 23 on the base of the trench 15 and the relatively highly doped diverter region 17. In order to obtain the same effect as with a diode on the trench base, however, the charge carrier life in the diverter region 17 is reduced by providing a buried layer 21, typically made of a silicide, below the trench base 29 in the diverter region 17.

This creates a region with an extremely high recombination rate, which can be achieved not only with a silicide but also with a metal or polysilicon layer, whereby the transistor gain of a parasitic transistor is suppressed in the region of the voltage dependent short circuit diverter structure 16.

Figure 6:
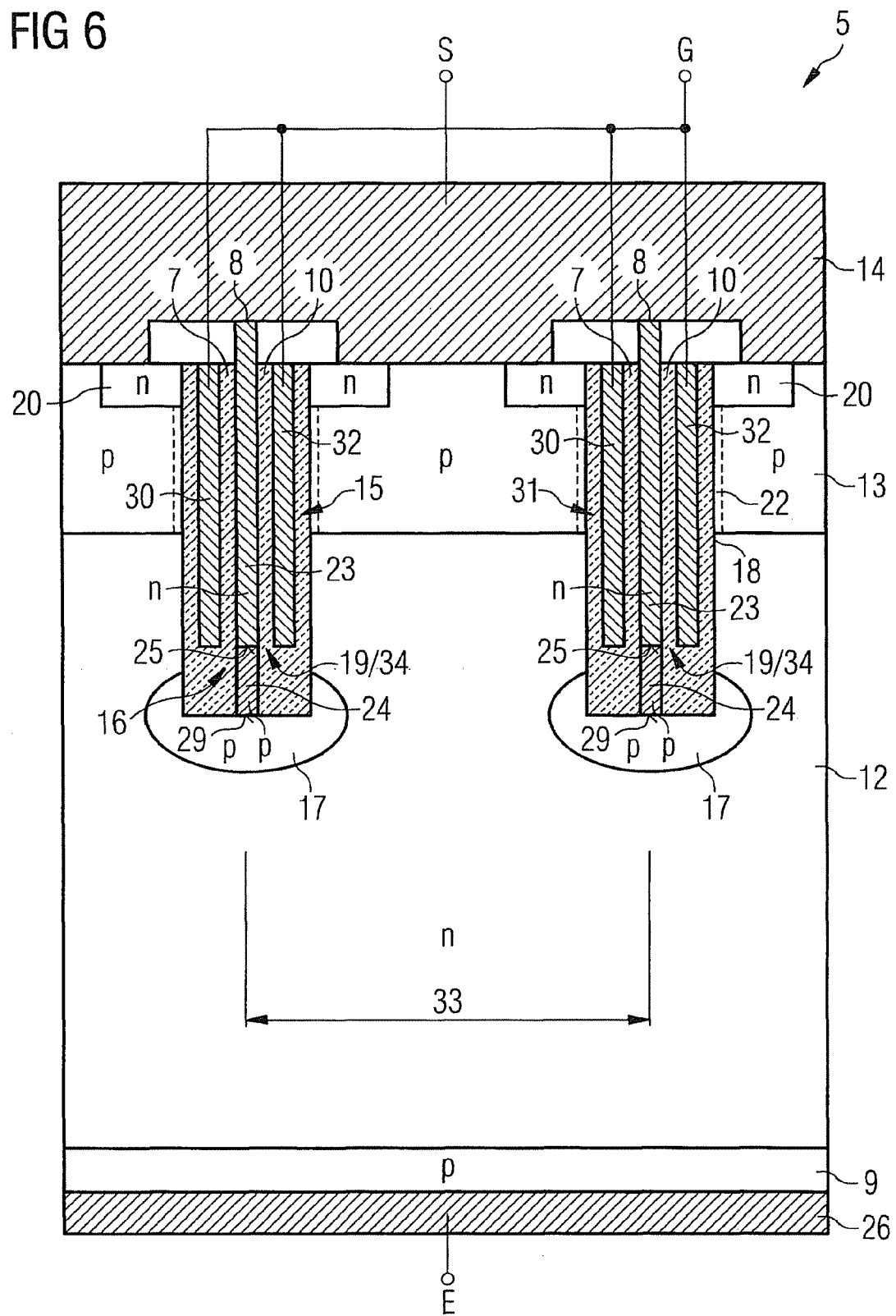
FIG. 6 illustrates a diagrammatic cross-section through a semiconductor device.

FIG. 6 illustrates a diagrammatic cross-section through a semiconductor device 5. Components of the same function as in the preceding figures are identified by the same reference numbers and not explained again. This embodiment differs from the previous embodiments in that the trench 15 includes gate electrodes 30 and 32 adjacent to each other and insulated from each other by vertical insulating layers 7 and 10 with the voltage limiting device 34 arranged in between.

Once again, a p-n junction 25 is provided in the lower region towards the diverter region 17, which junction includes a p-type diode region 24 and an n-type diode region 23, wherein the n-type diode region 23 extends along the entire trench 15 between the two gate electrodes 30 and 32 up to the first electrode 14, thereby establishing a connection 8 to the first gate electrode 14. The p-n junction 25 may alternatively be formed near the surface of the trench 15. This embodiment results in a compact structure for the semiconductor 5 owing to the multi-functional structure of the trench 15.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What we claim is:

1. A semiconductor device, comprising:
   a first semiconductor layer of a first conductivity type,
   a second semiconductor layer of a second conductivity type complementary to the first conductivity type arranged in or on the first semiconductor layer,
   a region of the first conductivity type arranged in the second semiconductor layer,
   a first electrode contacting the region of the first conductivity type and the second semiconductor layer,
   a trench extending into the first semiconductor layer, and
   a voltage dependent short circuit diverter structure including a highly-doped diverter region of the second conductivity type arranged via an end of a channel region and coupled to a diode arranged in the trench.

2. The semiconductor device according to claim 1, wherein the highly-doped diverter region is coupled to the first electrode via the diode.

3. The semiconductor device according to claim 1, wherein the diode comprises a region of the first conductivity type and a region of the second conductivity type forming a junction there between.

4. The semiconductor device according to claim 3, wherein the region of the second conductivity type of the diode is in contact with the highly-doped diverter region.

5. The semiconductor device according to claim 1, wherein an insulating layer extends along side walls of the trench and is discontinuous along the base of the trench.

6. The semiconductor device according to claim 1, wherein the trench further comprises a gate electrode, the gate electrode being electrically insulated from the regions of the first conductivity type and the second semiconductor layer and the first semiconductor layer.

7. The semiconductor device according to claim 6, wherein the diode is arranged underneath the gate electrode.

8. The semiconductor device according to claim 1, further comprising a second trench including a gate electrode, the diode being arranged in a trench different from the second trench.

9. The semiconductor device according to claim 1, further comprising a plurality of cells, each cell including a voltage dependent short circuit structure.

10. The semiconductor device according to claim 1, wherein gate electrodes and a voltage dependent short circuit structure are arranged spaced apart to each other in one single trench.

11. The semiconductor device according to claim 1, wherein the highly-doped diverter region is arranged in the vicinity of, and spaced at a distance from, the end of the channel region.

12. The semiconductor device according to claim 1, wherein the semiconductor device provides an insulated gate bipolar transistor.

13. A semiconductor device including a MOS-controlled semiconductor device, comprising:
    a channel region;
    a trench; and a voltage dependent short circuit diverter structure including a voltage limiting device arranged in the trench and coupled to a diverter region arranged at an end of the channel region.

14. The semiconductor device according to claim 13, wherein the diverter region is coupled via the voltage limiting device to an electrode of the MOS-controlled semiconductor device.

15. The semiconductor device according to claim 14, wherein the voltage limiting device is a forward-biased diode or a varistor or thyristor or a reverse-biased Zener diode.

16. The semiconductor device according to claim 14, wherein the MOS-controlled device is an insulated gate bipolar transistor.

17. An electronic component including a MOS-controlled semiconductor device, comprising:
    a channel;
    a trench;
    a diverter region arranged at an end of the channel; and
    means for diverting a short circuit current arranged in the trench and coupled to the diverter region and to an electrode of the MOS-controlled semiconductor device.

18. The semiconductor device according to claim 17, wherein the means for diverting a short circuit current is a forward-biased pn diode or a varistor or thyristor or a reverse-biased Zener diode.

19. A method for producing a semiconductor device, comprising:
    providing a semiconductor substrate including a first semiconductor layer of a first conductivity type, a second semiconductor layer of a second conductivity type complementary to the first conductivity type arranged in or on the first semiconductor layer, a region of the first conductivity type arranged in the second semiconductor layer, a first electrode contacting the region of the first conductivity type and the second semiconductor layer, and a trench extending into the first semiconductor layer,
    producing a highly-doped region of the second conductivity type at an end of a channel region,
    depositing a layer of the second conductivity type in the trench onto the highly-doped region of the second conductivity type, and
    depositing a layer of the first conductivity type in the trench onto the layer of the second conductivity type in the trench producing a junction there between.

20. The method according to claim 19, wherein an insulating layer is deposited in the trench onto the layer of the first conductivity type and a gate electrode is deposited onto the insulating layer.

21. The method according to claim 19, wherein the highly-doped region of the second conductivity type surrounds a base of the trench.

22. The method according to claim 19, wherein the highly-doped region of the second conductivity type is coupled to the first electrode via the layer of the second conductivity type arranged in the trench and the layer of the first conductivity type arranged in the trench.

* * * * *